US005708552A

United States Patent [19]
Han et al.

[11] Patent Number: 5,708,552
[45] Date of Patent: Jan. 13, 1998

[54] ELECTROSTATIC DISCHARGE PROTECTION GUIDE RAIL SYSTEM FOR PRINTED CIRCUIT BOARD

[75] Inventors: Jae-Sup Han; Kyu-Sop Song; Sung-Chul Kim; Nam-Il Her, all of Yusong-ku, Rep. of Korea

[73] Assignees: Electronics and Telecommunications Research Institute, Daejeon; Korea Telecommunication Authority, Seoul, both of Rep. of Korea

[21] Appl. No.: 743,253

[22] Filed: Nov. 4, 1996

[30] Foreign Application Priority Data

Nov. 14, 1995 [KR] Rep. of Korea .................. 95-41336

[51] Int. Cl.[6] ................................................ H05K 7/14
[52] U.S. Cl. ......................................................... 361/799
[58] Field of Search ........................... 361/724–728, 361/732, 736, 740–741, 747, 756, 759, 753, 799–800, 816, 818, 220, 223; 174/35 R, 35 GC; 439/92, 607, 609

[56] References Cited

U.S. PATENT DOCUMENTS

| | | | |
|---|---|---|---|
| 4,821,146 | 4/1989 | Behrens et al. | 361/692 |
| 5,029,041 | 7/1991 | Robinson et al. | 361/220 |
| 5,467,254 | 11/1995 | Brusati et al. | 361/799 |

FOREIGN PATENT DOCUMENTS 2258093  1/1993  United Kingdom .

OTHER PUBLICATIONS

Packaging Fundamentals for ESD Sensitive Products; Ronald J. Gibson; 1994; pp. 1417–1427.

Device Level ESD Testing Standards; L.R. Avery; pp. 1428–1442 (No Known Date).

Primary Examiner—Leo P. Picard
Assistant Examiner—Phuong T. Vu
Attorney, Agent, or Firm—Antonelli, Terry, Stout & Kraus, LLP

[57] ABSTRACT

An improved electrostatic discharge protection guide rail system for a PCB which is capable of providing an electrostatic discharge protection function so that a PCB of a plug-in unit disposed in a sub-rack of an electronic instrument from a damage due to an electrostatic discharge (ESD), which includes an ESD ground surface formed on the PCB, an engaging jaw portion formed in a lower portion of the guide rail and having a groove, and an insertion groove formed in a side portion of the guide rail in order for the ESD strip to be inserted therein, wherein the bent ESD strip is inserted into the insertion groove, the ESD ground surface contact portion and the ESD PCB contact portion are inserted into a groove formed in the engaging jaw portion of the guide rail, both ends of the ESD PCB having a copper plate are protruded beyond a side surface of a sub-rack and horizontally cross with respect to the parallel guide rails, and a ground cable is connected to both ends of the ESD PCB, respectively.

2 Claims, 4 Drawing Sheets

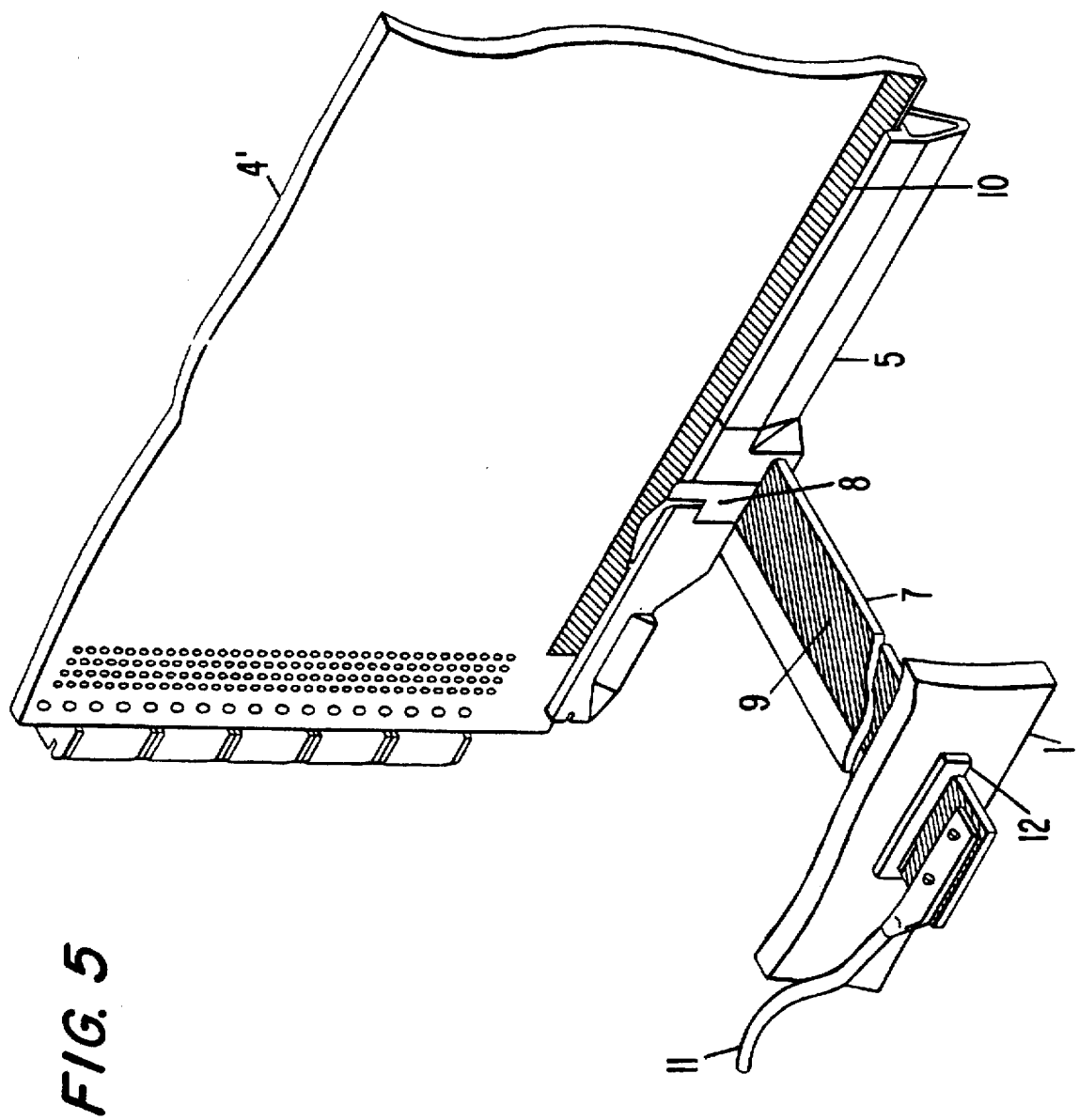

ELECTROSTATIC DISCHARGE PROTECTION GUIDE RAIL SYSTEM FOR PRINTED CIRCUIT BOARD

BACKGROUND OF THE INVENTION

1. Field of the Invention

The present invention relates to an electrostatic discharge protection guide rail system for a printed circuit board (PCB), and particularly, to an improved electrostatic discharge protection guide rail system for a PCB which is capable of providing an electrostatic discharge protection function so that it is possible to protect the components mounted on a PCB of a plug-in unit disposed in a sub-rack of an electronic instrument from a damage due to an electrostatic discharge (ESD).

2. Description of the Conventional Art

Recently, the construction of electronic instruments has become more complicated, and components in the instruments are accurately made and are mounted on a printed circuit boards (PCB).

Therefore, it is important to protect components mounted on PCBS from an electrostatic discharge.

In order to effectively prevent damage of the components mounted on the PCB from the above-described electrostatic discharge, an electrostatic discharge (ESD) ground surface for PCBS was defined as a plug-in unit standard in IEEE specification 1301 and 1301.1.

Various types of guide rail systems providing an ESD prevention function by connecting the ESD ground surface on the PCB to a ground have been intensively studied. The guide rail system for providing a ESD prevention function is adapted to a specific system in the industry. In addition, the above-described guide rail system has a complicated construction. Moreover, the method of connecting the ground surface of the PCB to a ground circuit presents some problems, so, there are some problems of actually using the guide rail system.

Therefore, in industry, a PCB guide rail system is needed which provides a ESD prevention function, to thus more effectively protect the components mounted on the PCB from ESD.

SUMMARY OF THE INVENTION

Accordingly, it is an object of the present invention to provide an improved electrostatic discharge protection guide rail system for a PCB which overcomes the problems encountered in the conventional art.

It is another object of the present invention to provide an improved electrostatic discharge protection guide rail system for a PCB which provides an electrostatic discharge protection function that prevents components mounted on a PCB of a plug-in unit disposed in a sub-rack of an electronic instrument from being damage due to.

To achieve the above objects, there is provided an improved electrostatic discharge protection guide rail system for a printed circuit board which includes: a plurality of printed circuit boards; a sub-rack; a plurality of parallel guide rails disposed in a lower portion of the sub-rack, each guide rail including a groove; an electrostatic discharge ground surface formed on each printed circuit board, each electrostatic discharge ground circuit surface contacting the groove of one of the guide rails; an engaging jaw formed in each guide rail, each engaging jaw being formed in a lower portion of one of the guide rails; a plurality of electrostatic discharge strips; an insertion groove formed in a side portion of each of the guide rails, each insertion groove receiving one of the electrostatic discharge strips; an electrostatic discharge printed circuit board having two conductive ends protruding beyond side surfaces of the sub-rack and which contacts the engaging jaws and the plurality of electrostatic discharge strips; and a ground cable connected to the conductive ends.

Additional advantages, objects and other features of the invention will be set forth in part in the description which follows and in part will become apparent to those having ordinary skill in the art upon examination of the following or may be learned from practice of the invention.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3A and 3B are detailed views illustrating an electrostatic discharge (ESD) strip insertion portion of a guide rail of FIG. 2, of which:

FIG. 3A is a top view illustrating an ESD strip insertion portion according to the present invention; and FIG. 3B is a side view illustrating the same;

FIGS. 4A and 4B are detailed views illustrating an ESD strip of FIG. 2, of which:

FIG. 4A is a top view illustrating the ESD strip; and

FIG. 4B is a side view illustrating the same; and

FIG. 5 is a perspective view illustrating a PCB guide rail system according to the present invention.

DETAILED DESCRIPTION OF THE INVENTION

Figure 1:
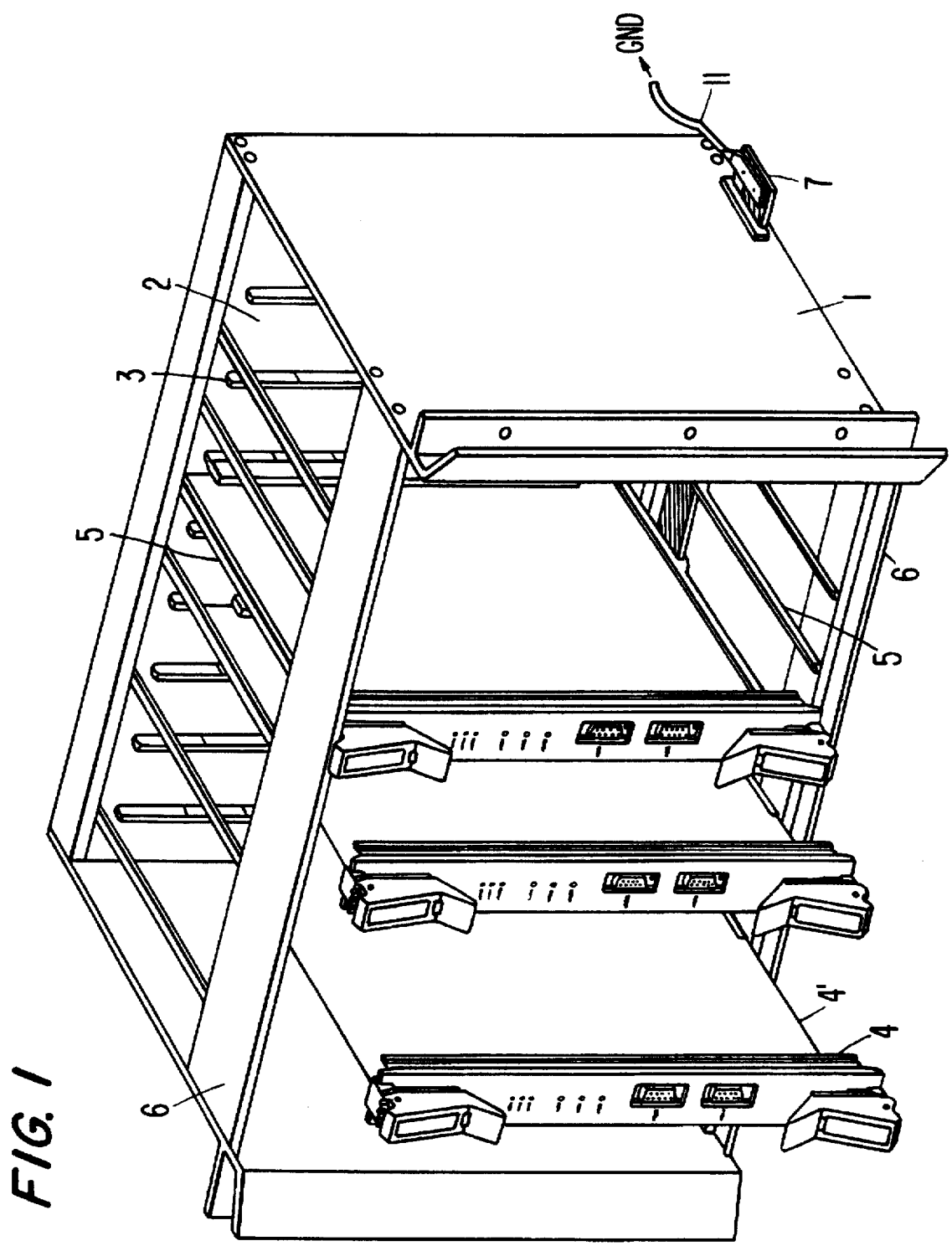
FIG. 1 is a perspective view illustrating a sub-rack including a PCB guide rail system according to the present invention.

FIG. 1 is a perspective view illustrating a sub-rack including a PCB guide rail system according to the present invention.

As shown therein, both ends of an electrostatic discharge (ESD) printed circuit board (PCB) 7 are connected to a ground cable 11, respectively, and protrude beyond the side surface of each sub-rack 1, with the PCB 4' being horizontally disposed along parallel guide rails 5 behind a back plane 2 (not shown), which will be described later. In addition, the ground cable 11 is connected to a ground circuit, for thus effectively grounding the components mounted on a PCB 4' of a plug-in unit connected to a connector 3 mounted on the back plane 2 behind the sub-rack 1.

A guide rail support 6 supports the guide rail 5.

Figure 2:
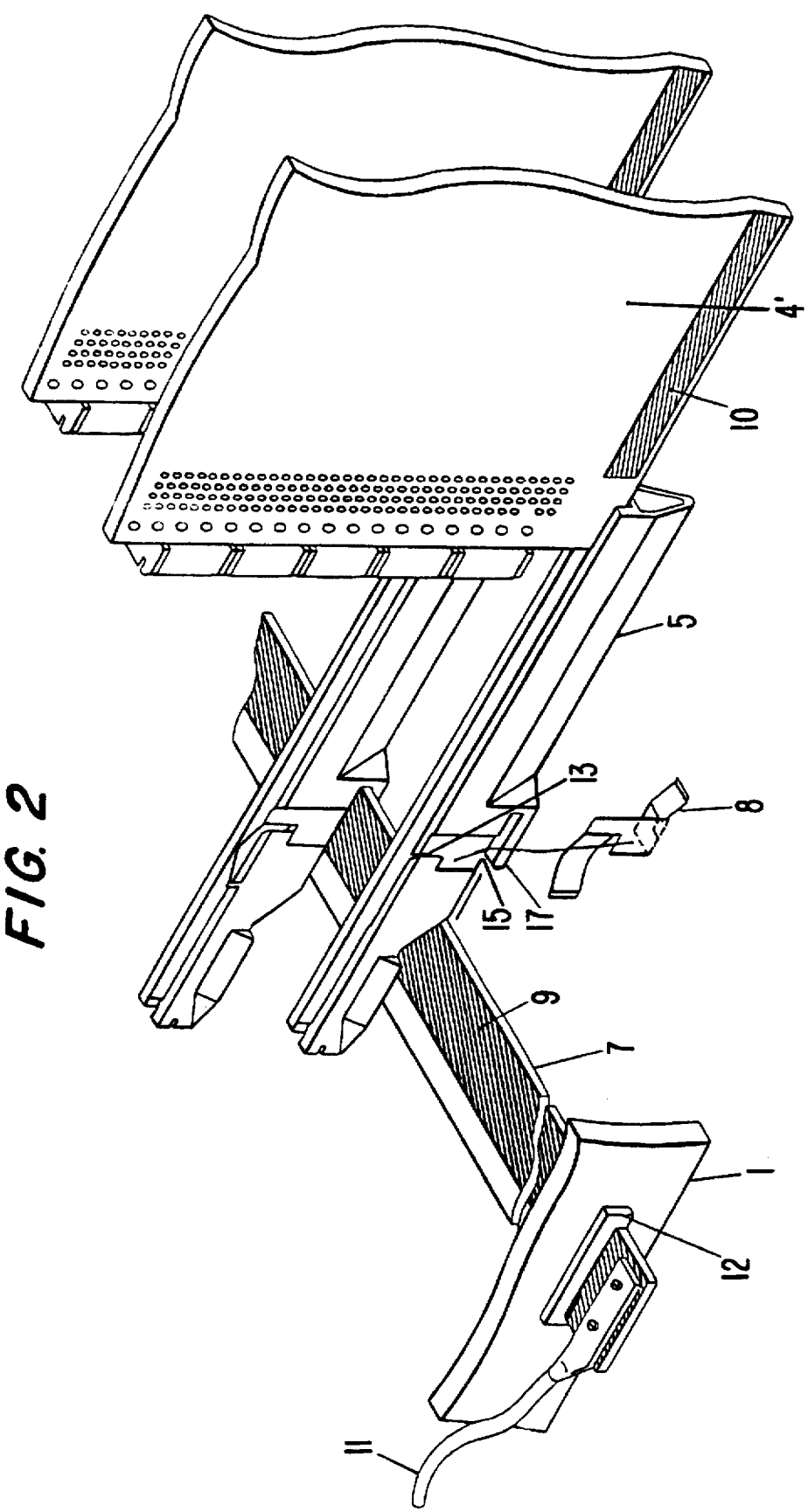
FIG. 2 is a perspective view illustrating a PCB guide rail system according to the present invention.

FIG. 2 is a perspective view illustrating a PCB guide rail system according to the present invention.

As shown therein, an ESD ground surface 10 is formed on the PCB 4' in compliance with the IEEE standards 1301 and 1301.1. An engaging jaw portion 17 is formed in a lower portion of the guide rail 5. An insertion groove 13 is formed in a portion of a side of the guide rail 5 for receiving the ESD strip 8 therein. Both ends of the ESD PCB 7 have a copper plate 9 passing through the sub-racks 1 insulated by an insulation member 12 from each sub rock the engaging protrusion 15 is inserted in a groove formed in the engaging jaw portion 17. The ground cable 11 is connected to both ends of the ESD PCB 7, respectively.

Figure 3A:
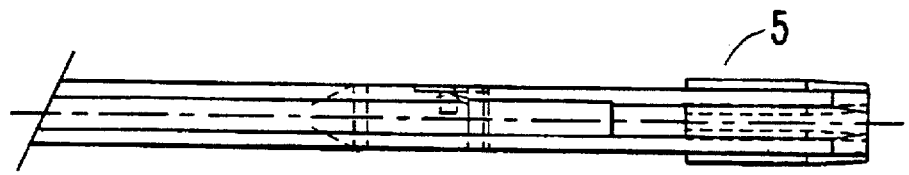
Figure 3B:
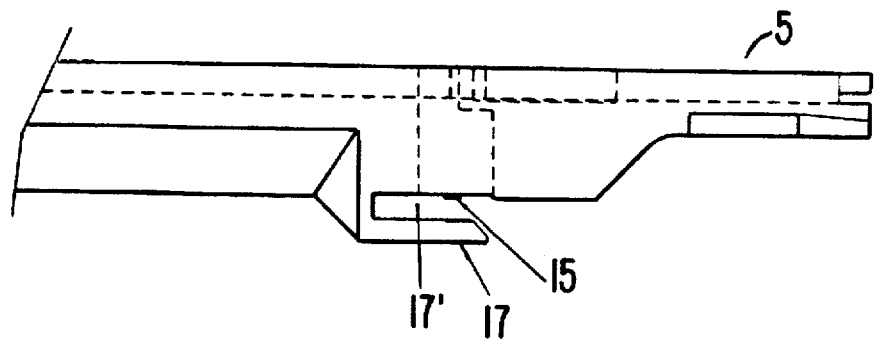

FIGS. 3A and 3B are detailed views illustrating an electrostatic discharge (ESD) strip insertion portion of a guide rail of FIG. 2, of which FIG. 3A is a top view illustrating an ESD strip according to the present invention, and FIG. 3B is a side view illustrating the same.

As shown therein, the engaging jaw portion 17 has a channel-shaped groove 17' formed in the lower portion of the guide rail 5. A rectangular-shaped engaging protrusion 15 is formed in the lower portion of the guide rail 5 to prevent the ESD strip inserted into the groove 17', formed in the engaging jaw portion 17 of the guide rail 5, from escaping therefrom.

Figure 4A:
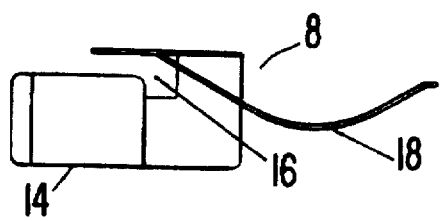
Figure 4B:
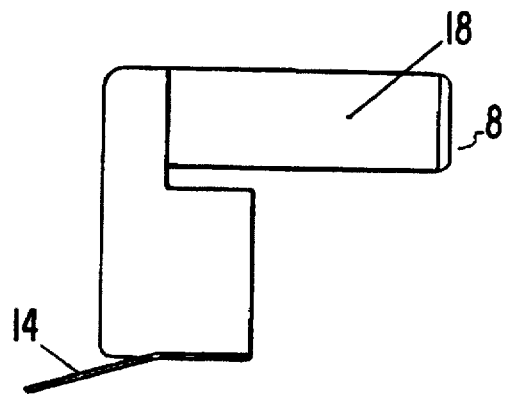

FIGS. 4A and 4B are detailed views illustrating an ESD strip of FIG. 2, of which FIG. 4A is a top view illustrating the ESD strip, and FIG. 4B is a side view illustrating the same.

As shown therein, in the ESD strip 8, an ESD ground surface contact portion 18 and an ESD PCB contact portion 14 are bent, and a rectangular-shaped hole 16 is formed in the side of the ESD PCB contact portion 14 in order for the engaging protrusion 15 of the guide rail 5 to be inserted therein.

FIG. 5 is a perspective view illustrating a PCB guide rail system according to the present invention.

As shown therein, when inserting the PCB 4' into the guide rail 5 according to the present invention, the ESD ground surface contact portion 18 of the ESD strip 8 inserted into an insertion groove 13 of the guide rail 5 contacts with the ESD ground surface 10 formed in a side of the PCB 4', and the ESD PCB contact portion 14 of the ESD strip 8 contacts with the copper plate 9 on the ESD PCB 7 inserted into the channel-shaped groove 17' having a female edge connector shape in the lower portion of the guide rail 5.

Therefore, the electrostatic discharge generated by the PCB 4' is transferred to the cooper plate 9 of the ESD PCB 7 through the ESD ground surface 10 of the PCB 4' and the ESD strip 8, and then is transferred to the ground circuit through the ground cable 11, thus protecting the components mounted on the PCB 4' from an electrostatic discharge.

As described above, the electrostatic discharge protection guide rail system for a PCB according to the present invention more effectively protects the components mounted on the PCB from an electrostatic discharge by providing a simple and effective grounding system, for thus improving the reliability of the products.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An electrostatic discharge protection guide rail system comprising:

a plurality of printed circuit boards;

a sub-rack;

a plurality of parallel guide rails disposed in a lower portion of the sub-rack, each guide rail including a groove;

an electrostatic discharge ground surface formed on each printed circuit board, each electrostatic discharge ground surface contacting the groove of one of the guide rails;

an engaging jaw formed in each guide rail, each engaging jaw being formed in a lower portion of one of the guide rails;

a plurality of electrostatic discharge strips;

an insertion groove formed in a side portion of each of the guide rails, each insertion groove receiving one of the electrostatic discharge strips;

an electrostatic discharge printed circuit board having two conductive ends protruding beyond side surfaces of the sub-rack and which contacts the engaging jaws and the plurality of electrostatic discharge strips; and a ground cable connected to the conductive ends.

2. An electrostatic discharge protection system in accordance with claim 1 wherein:

each guide rail includes an engaging protrusion formed in a lower portion thereof, the engaging protrusion being rectangular; and further comprising a rectangular hole formed in a side surface of the electrostatic discharge printed circuit board into which is inserted the engaging protrusion.

\* \* \* \* \*